United States Patent
Sousa Soares De Oliveira Braga

(10) Patent No.: US 12,040,398 B2
(45) Date of Patent: Jul. 16, 2024

(54) ONE-ELECTRODE CELL AND SERIES OF TWO OR MORE CELLS AS A DEVICE

(71) Applicant: UNIVERSIDADE DO PORTO, Oporto (PT)

(72) Inventor: Maria Helena Sousa Soares De Oliveira Braga, Oporto (PT)

(73) Assignee: UNIVERSIDADE DO PORTO, Oporto (PT)

( * ) Notice: Subject to any disclaimer, the term of this patent is extended or adjusted under 35 U.S.C. 154(b) by 0 days.

(21) Appl. No.: 17/613,992

(22) PCT Filed: May 26, 2020

(86) PCT No.: PCT/IB2020/054973
§ 371 (c)(1),
(2) Date: Nov. 24, 2021

(87) PCT Pub. No.: WO2020/240412
PCT Pub. Date: Dec. 3, 2020

(65) Prior Publication Data
US 2022/0223742 A1    Jul. 14, 2022

(30) Foreign Application Priority Data
May 26, 2019  (PT) ......................................... 115542

(51) Int. Cl.
*H01L 29/78* (2006.01)
*H10N 60/00* (2023.01)
*H10N 60/85* (2023.01)

(52) U.S. Cl.
CPC ....... *H01L 29/78391* (2014.09); *H10N 60/85* (2023.02); *H10N 60/99* (2023.02)

(58) Field of Classification Search
CPC ... H01L 29/78391; H10N 60/85; H10N 60/99
See application file for complete search history.

(56) References Cited

U.S. PATENT DOCUMENTS

2011/0241091 A1    10/2011    Dubourdieu et al.

FOREIGN PATENT DOCUMENTS

| EP | 3454406 A1 | 3/2019 | |
| JP | 2000090976 A * | 3/2000 | |
| WO | WO-2018062770 A1 * | 4/2018 | ............. C01D 15/00 |

OTHER PUBLICATIONS

Braga et al.: "Extraordinary Dielectric Properties at Heterojunctions of Amorphous Ferroelectrics", J. Am. Chem. Soc., vol. 140, Nov. 27, 2018 (Nov. 27, 2018), p. 17968-17976, XP055712966, DOI: 10.1021/jacs.8b09603, cited in the application, abstract, p. 17696; figure 1, figures 3-5.

(Continued)

*Primary Examiner* — Ermias T Woldegeorgis
(74) *Attorney, Agent, or Firm* — Leason Ellis LLP

(57) ABSTRACT

The present invention relates to a one-electrode cell and series of two or more cells as a device at temperatures from below to above room temperature comprising a very high permittivity ferroelectric.

In a device constituted by one or more ferroelectricity-induced superconductor cells, the cells do not have to be in physical contact with one another; one terminal can be connected to a first cell and the other connected to a third cell without physical contact between any of the three cells. With the spontaneous and dynamic alignment of the dipoles of the ferroelectric, a potential difference is induced in different points of the surface of the cell, cells or device and a current can be harvested by conductor-terminals.

The present invention can be used for contactless charging of energy storage devices and as a part of several components or products.

16 Claims, 6 Drawing Sheets

(56) References Cited

OTHER PUBLICATIONS

International Search Report for corresponding PCT Application No. PCT/IB2020/054973 dated Jul. 9, 2020 (5 pages).

* cited by examiner

ONE-ELECTRODE CELL AND SERIES OF TWO OR MORE CELLS AS A DEVICE

TECHNICAL FIELD

The present invention is an all-temperatures electrostatic-effect device comprising a very high permittivity ferroelectric and an electrode, a ferroelectric, a ferroelectricity-induced superconductor, a semiconductor, an insulator, a superconductor, a ferroelectric-based device or parts of thereof. It may also comprise the association of one-electrode ferroelectricity-induced superconductor with one or more than one electrodes, one-electrode cells or full cells. For observation and application of the phenomenon with subsequent harvesting of the generated potential difference, as in the Hall-effect, conductor-terminals are connected in different points of the cell, cells-association, or device. In a device constituted by one or more ferroelectricity-induced superconductor or ferroelectric insulator cells, the cells do not have to be in physical contact with one another; one terminal can be connected to a first cell and the other connected to a third cell without physical contact between any of the three cells. With the spontaneous and dynamic alignment of the dipoles of the ferroelectric, a potential difference is induced in different points of the surface of the cell, cells or device and a current can be harvested by conductor-terminals. Between two or several one-electrode cells, a one-electrode cell and one electrode, full cells, or devices, the electric field produced by the first at the interface is enough to induce a symmetric polarization on the second resulting in an accumulation of the charge carriers on one side of the surface and mirror charges on the other, like in the product of the Hall-effect.

BACKGROUND

A Ferroelectric material is a material that has spontaneous electric polarization that can be reversed by the application of an external electric field. All ferroelectrics are pyroelectrics, their natural electrical polarization is reversible and temperature related.

The Hall-effect is the creation of a potential difference across an electrical conductor. In the original Hall-effect, the potential difference is built-up from mirror charge accumulation due to an applied electric current which is perpendicular to an applied magnetic field. In the present invention, the effect is an electrostatic effect resulting on a potential difference across an electrical insulator or conductor and an electric force from charge built-up; it does not have to involve a transverse applied current or an applied magnetic field.

The development of novel architectures for harvesting and subsequently storing energy brings important benefits to humankind.

A superconductor is a material capable of showing zero resistance; it is, therefore, a property related with electrons. Superconductors are also able to maintain a current with no applied potential, a property exploited in superconducting electromagnets such as those found in MRI machines. Experiments have demonstrated that currents in superconducting coils can persist for years without any degradation. Several materials have been reported to show superconductivity, like Be, Ti, Zr, Zn, Sn, at low temperatures and the high temperature cuprate superconductors, such as $HgBa_2Ca_2Cu_3O_x$ or the iron based FeSe. The highest temperature superconductor known is $H_2S$ but it also requires high pressure.

A superconductor enables, therefore, the transmission of electrical power without any loss and exhibits no heat dissipation (no Joule effect).

Two-dimensional superconductivity can be generated at the interface between two materials with very different permittivities such as a ferroelectric and another material. This is due to an abrupt phase transition occurring at the material/ferroelectric insulator interface (the permittivity changes abruptly), which spontaneously breaks symmetry and induces 2D superconductivity.

Superconductivity can happen along the interface of a metal and a ferroelectric with very high permittivity. 2D superconductivity can also happen along the interface of air/ferroelectric, ionic liquid/ferroelectric, semiconductor/ferroelectric such as in the devices presented herein.

An electric current can be conducted on the surface of a ferroelectric-superconductor from one interface to another, through the surface, while dipole alignment and polarization remains. This phenomenon can lead to years-long charge, even while discharging a device cell.

Ferroelectric-glasses with extremely high dielectric constant such as $Li_{3-2y}M_yXO$ (M=Be, Ca, Mg, Sr, Ba; X=Cl, Br, I), $Li_{3-3y}A_yXO$ (M=B, Al; X=Cl, Br, I), $Na_{3-2y}M_yXO$ (M=Be, Ca, Mg, Sr, Ba; X=Cl, Br, I), $Na_{3-3y}A_yXO$ (M=B, Al; X=Cl, Br, I), $K_{3-2y}M_yXO$ (M=Be, Ca, Mg, Sr, Ba; X=Cl, Br, I), $K_{3-3y}A_yXO$ (M=B, Al; X=Cl, Br, I) or crystalline materials $Li_{3-2y-z}M_yH_zXO$ (M=Be, Ca, Mg, Sr, and Ba; X=Cl, Br, I), $Li_{3-3y-z}A_yH_zXO$ (M=B, Al; X=Cl, Br, I), $Na_{3-2y-z}M_yH_zXO$ (M=Be, Ca, Mg, Sr, and Ba; X=Cl, Br, I), $Na_{3-3y-z}A_yH_zXO$ (M=B, Al; X=Cl, Br, I), $K_{3-2y-z}M_yH_zXO$ (M=Be, Ca, Mg, Sr, and Ba; X=Cl, Br, I), $K_{3-3y-z}A_yH_zXO$ (M=B, Al; X=Cl, Br, I) where $0 \leq y \leq 1$ and $0 \leq z \leq 3$ a mixture of thereof or a mixture of thereof with $CaCu_3Ti_4O_{12}$, $BaTiO_3$, $YBa_2Cu_3O_{7-x}$, $SrTiO_3$ or other ferroelectric or superconductors materials, or their mixtures with $Cu_2O$, $SiO_2$, $Li_2S$, $Li_2O$, LiI, $Na_2S$, $Na_2O$, NaI, $K_2S$, $K_2O$, KI, $Al_2O_3$, $MgB_2$, $H_2O$, $H_2S$, polymers, ionic liquids, or other solvents or ionic materials can become superconductor at the interface with a material with a substantially different dielectric constant; that material can even be air which make the ferroelectric materials 2D superconductors in the absence of a "cell" or a "device".

A one-electrode cell is, hereafter, a cell constituted by one electrode in contact with a high dielectric constant material. The cell can have a protective layer on the top of the high dielectric constant material. The electrode can be a conductor or a semiconductor or a mixture thereof. The terminals of the cell can be attached to different points in the electrode, possibly located at opposed sides, and can be in contact with the surface of the high dielectric constant material.

A full cell is a two, or more, electrodes cell with a ferroelectric material in between them. The electrodes can be similar or dissimilar.

An association of one-electrode cells, full cells or a mixture thereof is, hereafter, an association in which the cells were positioned as if they were to be connected to each other (possibly in series) aligning a quasi-parallel side with the closest cell/cells. The cells can be connected through same-type electrodes, or through dissimilar electrodes. The first cell in line can be connected to the third, without the second being connected to the first and third.

SUMMARY OF THE INVENTION

The present invention is directed to a ferroelectric-induced potential difference between two different points of a conductor in contact, or just in the proximity of a very high dielectric constant ferroelectric or between the surface of a ferroelectric and the conductor-collector in contact with it, or between two one-electrode cells, or between a full-cell or an association of cells that can perform from below to above room temperature.

The present invention is directed to a ferroelectric polarization and electrostatically induced potential difference in a conductor, a semiconductor, a one-electrode cell, a full-cell or a cell association and a ferroelectricity-induced superconductor surface current.

It is a feature of this invention to provide ferroelectricity-induced charge accumulation in a conductor, a semiconductor, an insulator, in a cell, or a cell association with no physical contact (physical separated) with the ferroelectric.

It is a feature of this invention to provide ferroelectricity-induced charge accumulation in an electrode, a full cell, a cell association, and therefore, induce a potential difference without recurring to Faraday's law of electromagnetic induction which comprises a change in magnetic flux, without recurring to a magnetic field and a transverse current as in the original Hall-effect, and without recurring to friction or any mechanical interaction with any of the materials. This invention provides, therefore, a way to continuously charge, or self-charge, a cell or a cells association without any physical contact.

The present invention disclose a one-electrode cell comprising a ferroelectric-insulator and an electrode, a ferroelectric, a ferroelectricity-induced superconductor, a semiconductor, an insulator, a superconductor, a ferroelectric-based device or parts of thereof with terminals connected to the cell in different points wherein the ferroelectric-insulator has a dielectric constant $\varepsilon_r$ higher than $10^3$ at the interface and at temperatures from −40° C. to 170° C.

Furthermore, the invention reveals the one-electrode cell where the ferroelectric-insulator is $Li_{3-2y}M_yXO$ (M=Be, Ca, Mg, Sr, Ba; X=Cl, Br, I), $Li_{3-3y}A_yXO$ (M=B, Al; X=Cl, Br, I), $Na_{3-2y}M_yXO$ (M=Be, Ca, Mg, Sr, Ba; X=Cl, Br, I), $Na_{3-3y}A_yXO$ (M=B, Al; X=Cl, Br, I), $K_{3-2y}M_yXO$ (M=Be, Ca, Mg, Sr, Ba; X=Cl, Br, I), $K_{3-3y}A_yXO$ (M=B, Al; X=Cl, Br, I) or crystalline materials like $Li_{3-2y-z}M_yH_zXO$ (M=Be, Ca, Mg, Sr, and Ba; X=Cl, Br, I), $Li_{3-3y-z}A_yH_zXO$ (M=B, Al; X=Cl, Br, I), $Na_{3-2y-z}M_yH_zXO$ (M=Be, Ca, Mg, Sr, and Ba; X=Cl, Br, I), $Na_{3-3y-z}A_yH_zXO$ (M=B, Al; X=Cl, Br, I), $K_{3-2y-z}M_yH_zXO$ (M=Be, Ca, Mg, Sr, and Ba; X=Cl, Br, I), $K_{3-3y-z}A_yH_zXO$ (M=B, Al; X=Cl, Br, I) where $0 \leq y \leq 1$ and $0 \leq z \leq 3$ a mixture of thereof or a mixture of thereof with $CaCu_3Ti_4O_{12}$, $BaTiO_3$, $YBa_2Cu_3O_{7-x}$, $SrTiO_3$ or other ferroelectric or superconductors materials, or their mixtures with $Cu_2O$, $SiO_2$, $Li_2S$, $Li_2O$, $LiI$, $Na_2S$, $Na_2O$, $NaI$, $K_2S$, $K_2O$, $KI$, $Al_2O_3$, $MgB_2$, $H_2O$, $H_2S$, polymers, ionic liquids, or other solvents or ionic materials.

Additionally, the one-electrode cell could present the ferroelectric-insulator mixed with a polymer, a resin, a plasticizer, a glue or another binder.

Moreover, the one-electrode cell of the present invention has the possibility that the ferroelectric-insulator is embedded in a matrix such as cellulose, fibre glass, or cloth.

The present invention also discloses a one-electrode cell where the electrode-conductor is Al, Zn, Mg, K, Li, Na, an alloy, a compound, a composite, a mixture or a foam.

The one-electrode cell can present a configuration in that the electrode-conductor is C, Cu, Fe, Ni, Sn, Ti, brass, bronze, an alloy, a compound, a composite or a foam.

The one-electrode cell can present a further configuration in that the electrode-conductor is C-foam, C-nanotubes, C-felt, C-paper, graphite, or graphene.

The one-electrode cell can present a further configuration in that the electrode-semiconductor is Si, Ga, GaAs p- or n-doped Si or p- or n-doped Ga or other semiconductors such as $BaTiO_3$.

The one-electrode cell can present a further configuration in that the electrode and ferroelectric-insulator has a rectangular, a disk, a ring, a toroidal or any regular or irregular shape.

The one-electrode cell can present a further configuration in that the electrode and ferroelectric-insulator has a saw shaped edge or any other shape that propitiates charge accumulation.

The one-electrode cell can present a further configuration in that the cell is protected by an insulator protective layer.

The one-electrode cell can present a further configuration in that the cell is enclosed in a package.

The present invention also disclose a series of two or more one-electrode cells as defined above wherein the two or more cells are aligned to each other and the cells are separated by a mm- or cm-distance with no physical contact or wherein the two or more cells are in contact such that the negative electrode of one cell connects with the positive electrode of the next cell adding cell potentials.

Furthermore, the invention reveals the series in which the cell is a conductor, a semiconductor or a superconductor.

Additionally, the series could present two electrodes that have a ferroelectric-insulator in between.

The series can present a further configuration in that a full cell is a series of two one-electrode cell where electrodes are similar or are dissimilar.

The series can present a further configuration in that the electrodes are Zn and C.

The series can present a further configuration in that a load is connected to the negative electrode of a cell and the positive electrode of a different cell.

The series can present a further configuration in that the load is a LED.

The series can present a further configuration in that the two conductor electrodes are separated by one or more alternated ferroelectric and/or insulator materials layer-pairs.

The use of the cell or the series of two or more one-electrode cells as defined presents several applications, for example: as a device for an energy harvester, energy storage device, part of a transistor, of a computer, of a quantum computer, of a sensor, of a charger, of an actuator, of a thermionic device, of a temperature controller, of the Internet of Things, of a photovoltaic cell, of a panel, of a wind turbine, of a smart grid, of an electric power transmission, of a transformers, of a power storage devices, of an electric motor, of an airplane, of a car, of a boat, of a submarine, of a satellite, of a drone, of a rocket and/or of a space vehicle.

DESCRIPTION OF THE DRAWINGS

These and other features, aspects and advantages of the present invention will become better understood with reference to the following description and appended claims, and accompanying drawings wherein.

FIG. 12 (photos) is an example of FIG. 12 embodiment;

DESCRIPTION OF THE INVENTION

The preferred embodiments of the present invention are illustrated by way of example below and in FIGS. 1-18. The latter are just examples and for simplification most of the cells were drawn as squares, but they can be rectangular, disk-like, ring, toroidal, irregular or they can have many edges like a saw to accumulate charge in defined points.

Figure 1:
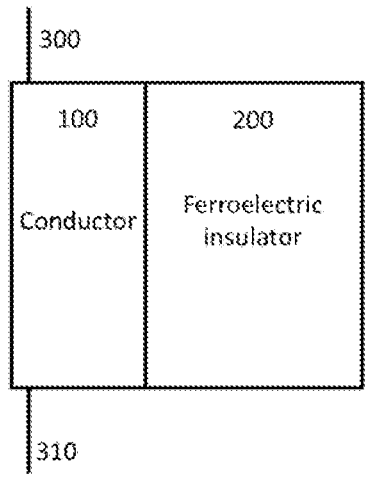
FIG. 1 is the embodiment of a one-electrode cell seen from its side view.

FIG. 1 shows a side view of a one-electrode cell 10, a conductor substrate 100 is put into contact with a ferroelectric insulator 200 with very high dielectric constant. The cell can be protected from moisture by a protective layer or package not represented in FIG. 1. The terminals 300 and 310 collect the electrical current after a potential difference has been induced in the cell.

Figure 2:
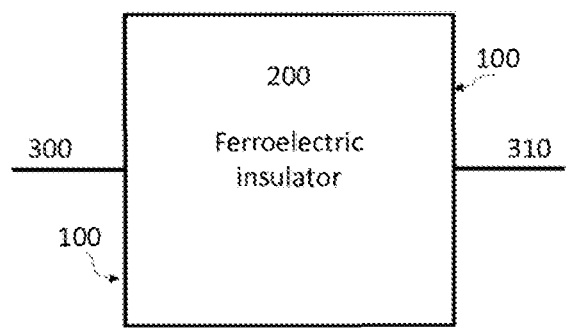
FIG. 2 is the embodiment of a one-electrode cell seen from its top or bottom view.

FIG. 2 shows a top view 20 of the cell 10 in FIG. 1.

Figure 3:
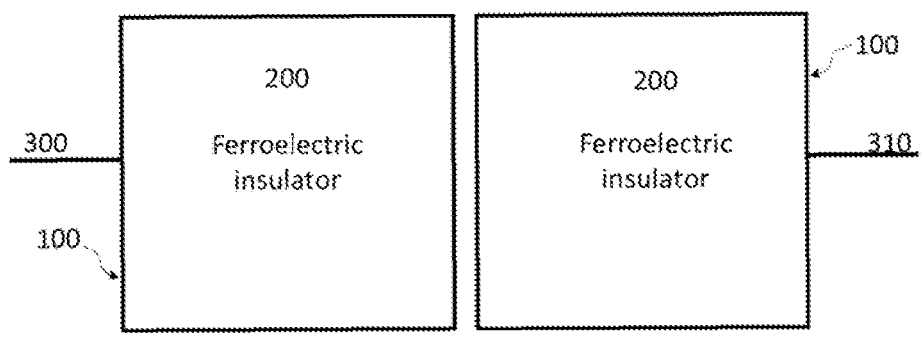
FIG. 3 is the embodiment of two one-electrode cells set as if they were to connect in series but without any physical contact between them.

FIG. 3 shows two cells 20 set 30 as if they were to be connected in series but without any physical contact between them. A "capacitor" is formed between the two cells 20 due to the spontaneous polarization of the ferroelectric-insulator 200. The insulator between cells can be air, epoxy, Teflon, a polymer, a glue, an ionic liquid or other dielectric material.

Figure 4:
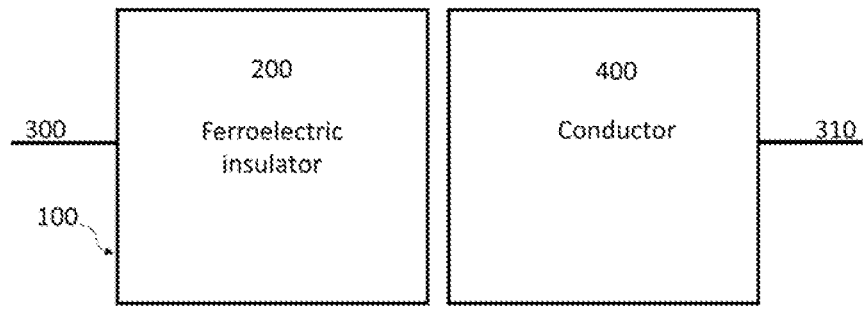
FIG. 4 is the embodiment of one-electrode cell and one conductor electrode set as if cell and electrode were to connect in series but without any physical contact between them.

FIG. 4 shows one cell 20 set 40 as if the cell were to be connected in series with an electrode-conductor 400 but without any physical contact between them. A "capacitor" is formed between cell 20 and electrode 400 due to the spontaneous polarization of the ferroelectric-insulator 200 inducing a Hall-effect in the conductor 400.

Figure 5:
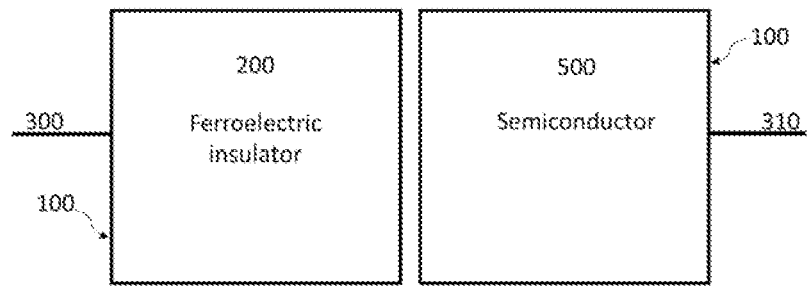
FIG. 5 is the embodiment of one-electrode cell and one semiconductor electrode set as if cell and electrode were to connect in series but without any physical contact between them.

FIG. 5 shows one cell 20 set 50 as if the cell were to be connected in series with an electrode-semiconductor 500 but with no physical contact between them. A "capacitor" is formed between cell 20 and electrode 500 due to the spontaneous polarization of the ferroelectric-insulator 200. If the semiconductor is n- or p-doped a drift of negative or positive charges takes place causing accumulation of charges in the semiconductor and therefore a potential difference for different points at the surface.

Figure 6:
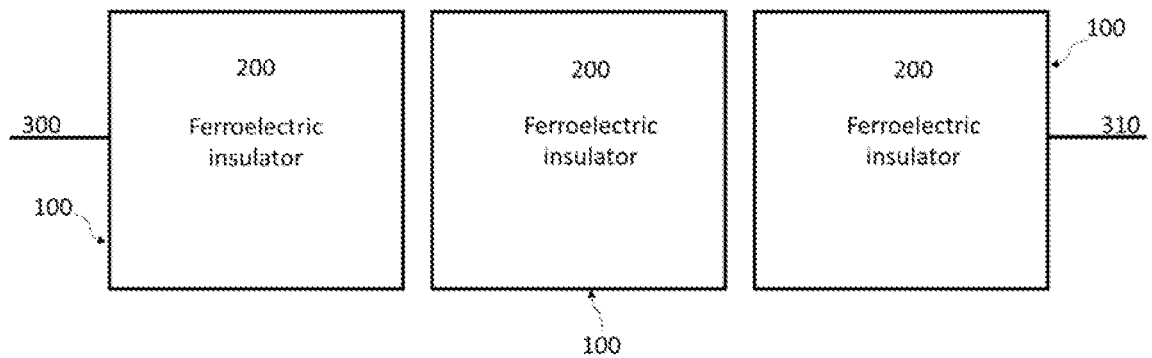
FIG. 6 is the embodiment of three one-electrode cells set as if they were to connect in series without any physical contact between the first cell and the second and the second and the third cells.

FIG. 6 shows three cells 20 set 60 as if the cells were to be connected in series but with no physical contact between the first and the second and the second and the third. Two "capacitors" form, between the first and the second cell, and the second and the third cells due to the spontaneous polarization of the ferroelectric-insulator 200.

Figure 7:
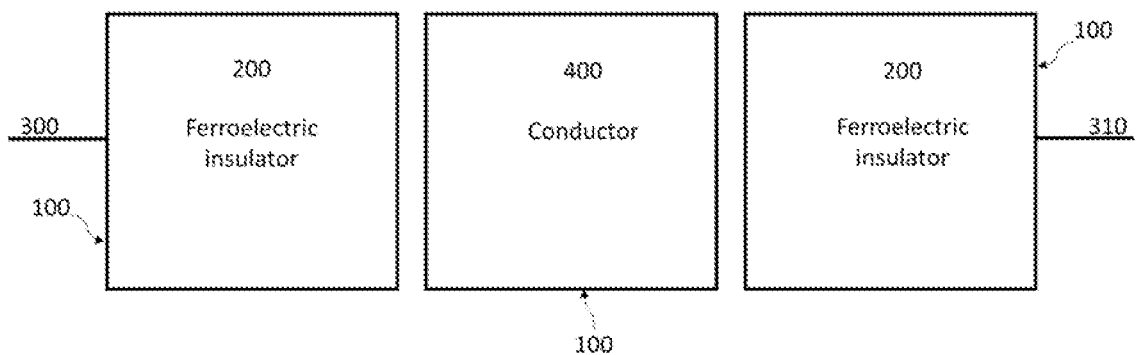
FIG. 7 is the embodiment of two one-electrode cells and an electrode-conductor set as if they were to connect in series but with no physical contact between the first cell and the electrode-conductor and the electrode and the third cell.

FIG. 7 shows two cells 20 located in the extremes of the set 70 as if the cells were to be connected in series with an electrode-conductor 400 in between with no physical contact between them. Two "capacitors" are formed, between the first cell and the electrode 400, and the electrode 400 and the second one-electrode cell due to the spontaneous polarization of the ferroelectric-insulator 200.

Figure 8:
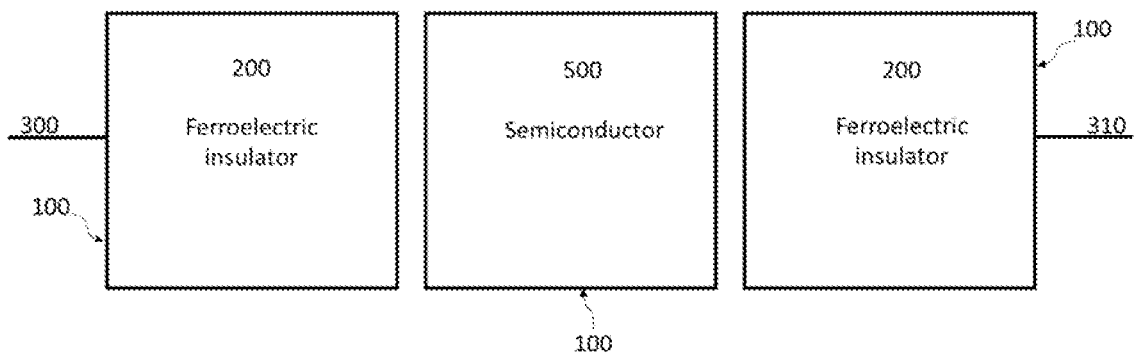
FIG. 8 is the embodiment of two one-electrode cells and an electrode-semiconductor set as if they were to connect in series but with no physical contact between the first cell and the electrode-semiconductor and this same electrode and the third cell.

FIG. 8 shows two cells 20 located in the extremes of the set 80 as if the cells were to be connected in series with an electrode-semiconductor 500 in between without any physical contact between them. Two "capacitors" are formed, between the first cell and the electrode 500, and the electrode 500 and the second cell due to the spontaneous polarization of the ferroelectric-insulator 200.

Figure 9:
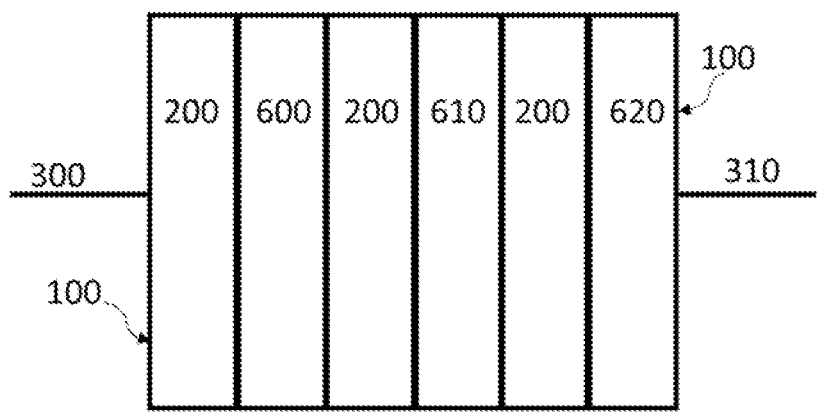
FIG. 9 is the embodiment of a multilayer cell with alternate layers of the ferroelectric material and insulator in which the insulator retains the ferroelectric-superconducting surface electrons at the interface with an insulator forming a capacitor between the electrons and the positive mirror charge on the insulator.

FIG. 9 shows a multilayer cell 90 formed by one or several ferroelectric-insulator 200 and insulator 600 to 620 layers. The insulator can be air, epoxy, Teflon, a polymer, a glue, an ionic liquid, an acrylic or other dielectric material. The very high dielectric constant of the ferroelectric-insulator creates an electric field that polarizes the dielectric. Moreover, the insulators 600 to 620 do not allow most of the surface superconductor electrons to tunnel through them, and instead they polarize at the surface with the ferroelectric due to the electric field spontaneously created by the ferroelectric. Therefore, the insulator will show a potential difference between the two surfaces parallel to the surface of the ferroelectric.

Figure 10:
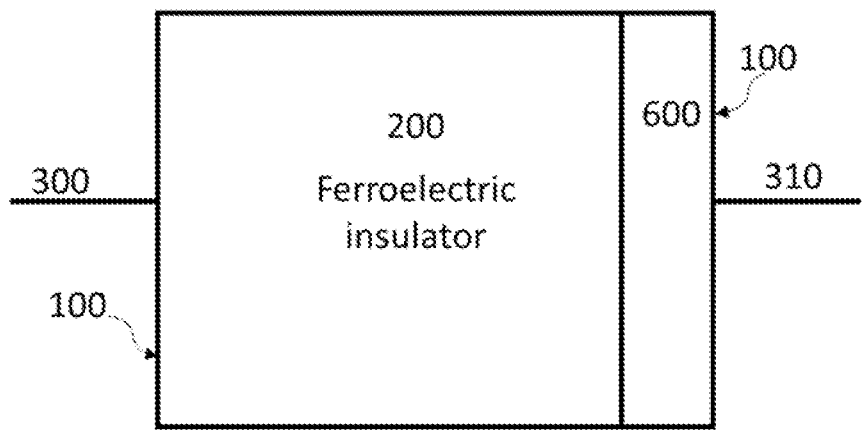
FIG. 10 is the embodiment of a ferroelectric/insulator cell in which the insulator retains the ferroelectric-superconducting surface electrons at the interface forming a capacitor between the electrons and the positive mirror charge on the insulator.

FIG. 10 shows a ferroelectric/insulator cell 100. The insulator 600 can be any dielectric material; at the interface of the cells a capacitor forms due to the spontaneous alignment of the electrochemical potentials and spontaneous polarization of the ferroelectric 200 giving rise to surface superconductivity.

Figure 11:
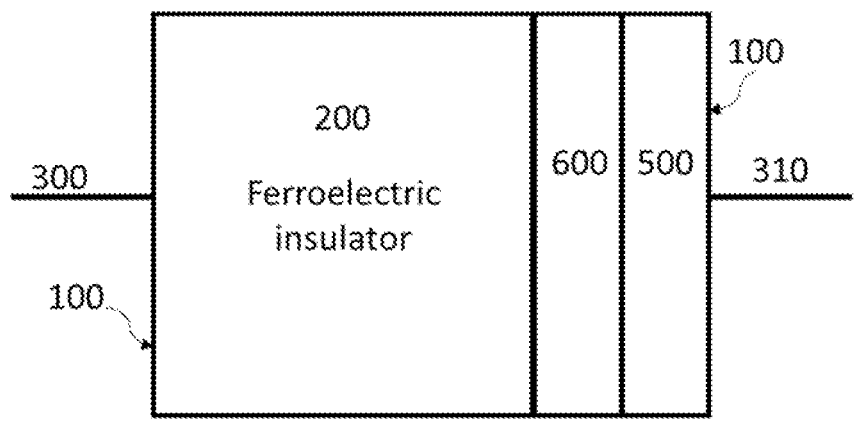
FIG. 11 is the embodiment of a ferroelectric/insulator cell in which the insulator retains the ferroelectric-superconducting surface electrons at the interface forming a capacitor between the electrons and the positive mirror charge on the insulator, at the interface insulator/semiconductor another capacitor is spontaneously formed.

FIG. 11 shows a ferroelectric/insulator/semiconductor cell 110. The insulator can be any dielectric material and at the interface of the cells a capacitor will be formed due to the spontaneous alignment of the electrochemical potentials and spontaneous polarization of the ferroelectric 200 giving rise to surface superconductivity. At the interface insulator 600 and the semiconductor 500 another capacitor is formed. The semiconductor can be Si, Ge, GaAs, GaN, GaP, $Cu_2O$ or any other material with a band gap energy usually around $0.2 \leq E_g \leq 3$ eV or higher.

Figure 12:
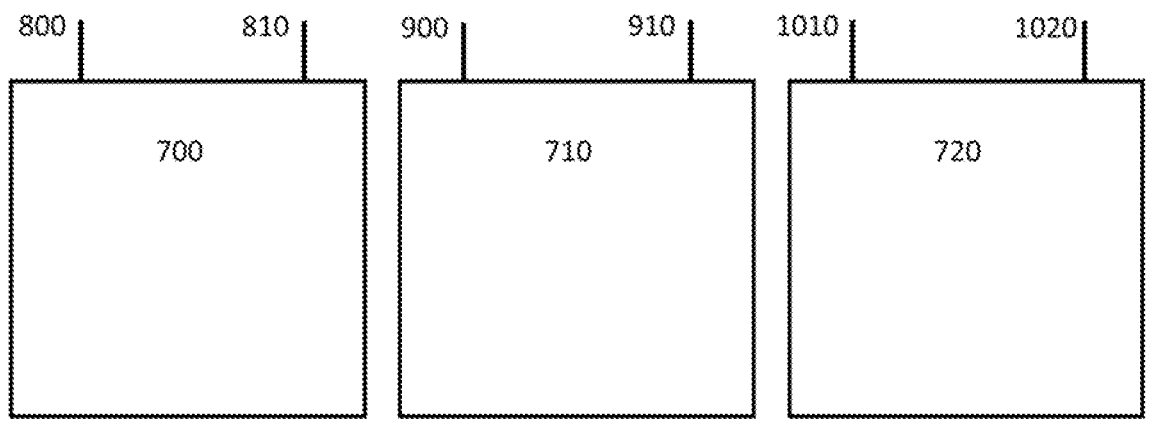
FIG. 12 is the embodiment of three full cells set as if they were in series but without any physical contact between the first cell and the second and the second and the third cells.

FIG. 12 shows three full cells set 120 with terminals 800, 810, 900, 910, 1000, and 1010 as if they were to be connected in series but with no physical contact between cells 700 and 710, and cells 710 and 720. Two "capacitors" are formed, the first between cells 700 and 710 and the second between cells 710 and 720.

Figure 13:
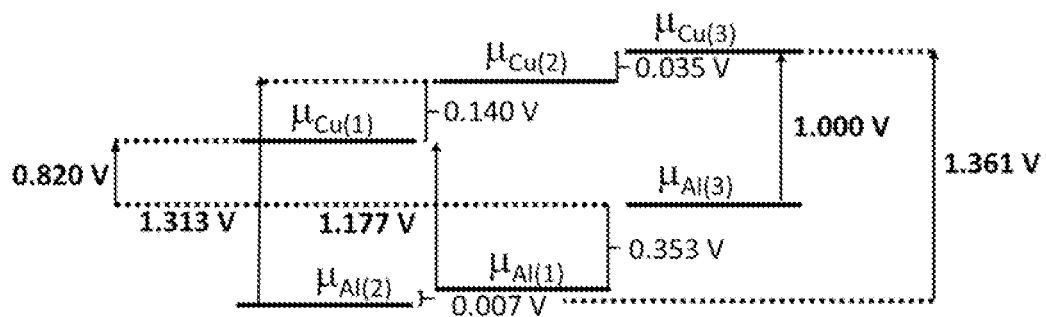
FIG. 13 is an embodiment of a "step" graph corresponding to the measured electrochemical potentials difference between any two electrodes of three full cells set as if they were to connect in series but not allowing any physical contact between the first cell and the second and the second and the third cells.

FIG. 13 shows an example of a "step" graph 130 of the electrochemical potentials in a device 120 constituted by cells of the type 700, 710 and 720 each one constituted by dissimilar electrodes of Cu and Al. Measurements of the difference between electrochemical potentials of similar electrodes Cu(1), Cu(2) and Cu(3) and of similar electrodes Al(1), Al(2) and Al(3) as well as measurements of the electrochemical potential difference of combinations of dissimilar cell electrodes were obtained. The maximum potential difference was obtained between dissimilar electrodes of different cells (2) and (3) $\mu_{Cu}(3)-\mu_{Ag}(2)=1.361$ V, which marks a clear difference from any other previously reported device. If the cells were connected in series, the potential difference would be V=1.177+1.313+1.000=3.490 V, if the cells were connected in parallel, the potential difference would be the same no matter which two dissimilar electrodes were chosen to measure the potential difference.

Figure 14:
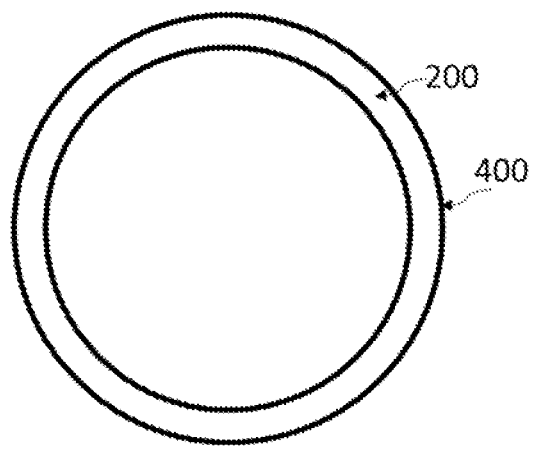
FIG. 14 is the embodiment of a conductor ring, coil or toroidal partially-filled or filled with the ferroelectric material.

FIG. 14 shows a shallow ring, coil or toroidal cell 140 in which the ring is filled or partially filled with ferroelectric that is going to polarize spontaneously and eventually show surface superconductivity. The electrons in a ring or toroid are then free to be conducted in the ring.

Figure 15:
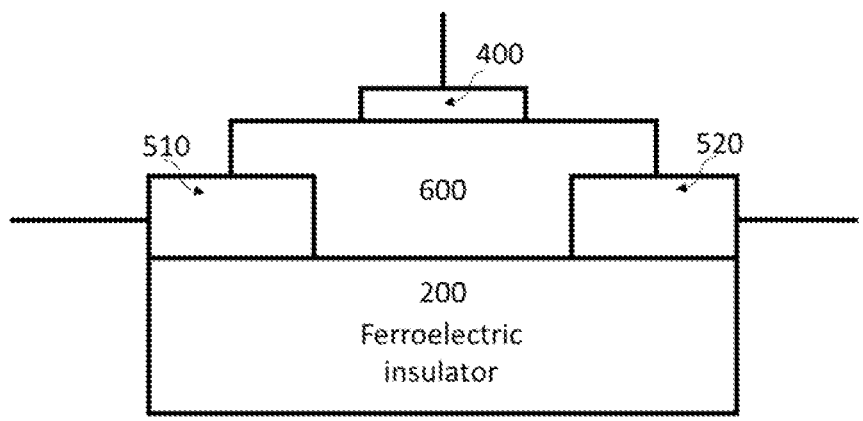
FIG. 15 is an embodiment of a ferroelectric/insulator/semiconductor cell which can amplify or switch electronic signals.

FIG. 15 shows a ferroelectric/insulator/semiconductor cell 150 which can amplify or switch; in this cell the ferroelectric insulator 200 can be negatively polarized at the interface with the insulator 600 and semiconductors 510 and 520 (such as n-doped semiconductors). The negative polarization is due to surface superconductivity and can give rise to a channel where electrons are conducted.

Figure 16:
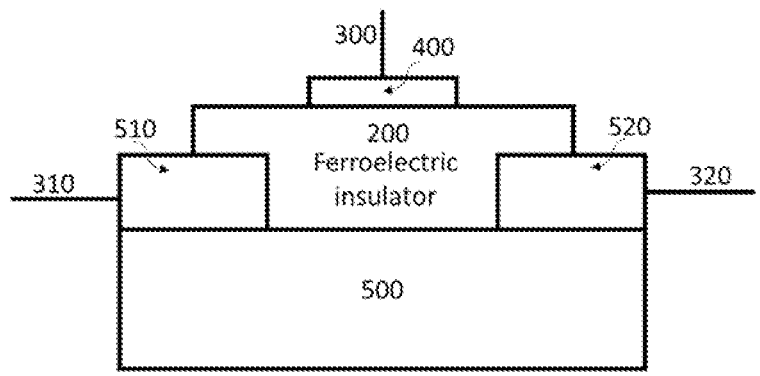
FIG. 16 is an embodiment of a ferroelectric/semiconductors cell which can amplify or switch electronic signals.

FIG. 16 shows a ferroelectric/semiconductors cell 160 which can amplify and switch; in this cell the ferroelectric insulator 200 can be positively polarized at the interface with the semiconductors 500, 510 and 520. The mirror negative charges will be aligned at the interface with the conductor 400.

Figure 17:
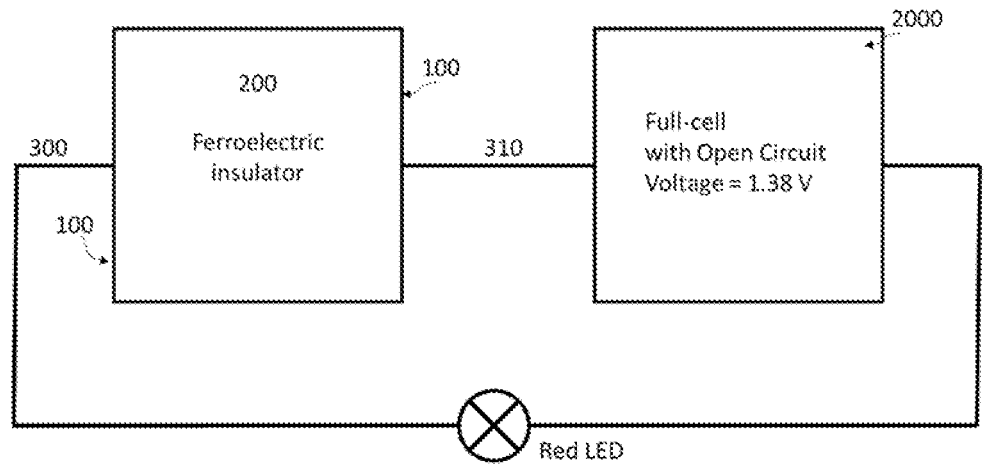
FIG. 17 is an embodiment of an association in series between a one-electrode cell and a full cell with open circuit voltage, OCV=1.38 V; a red LED that lights at a minimum potential of 1.48 V and minimum input current of 23 μA, which is lit by this association in series.

FIG. 17 shows an example of closed circuit constituted by an association in series 170, with physical contact between a full cell 2000, with open circuit voltage OCV 1.38 V, a one-electrode cell 20, and a red LED. The red LED is lit. Since the OCV of the full cell is not enough to light the red LED, the contribution of the one-electrode cell 20 is proven, which clearly shows that one electrode cell can harvest and store energy.

Figure 18:
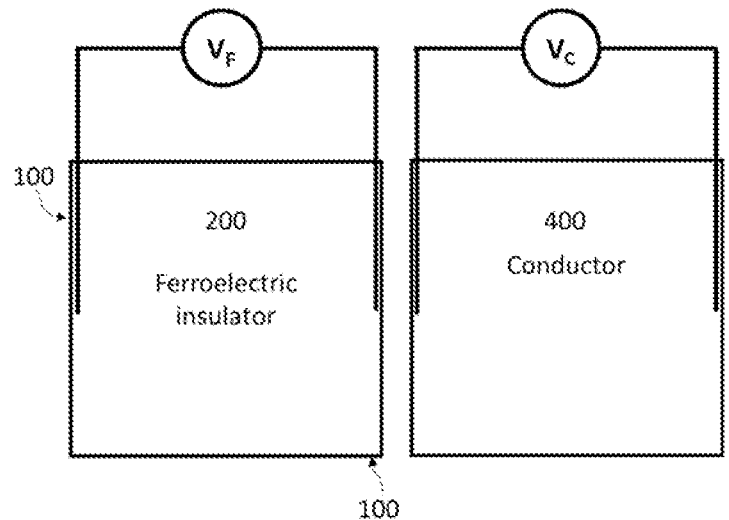
FIG. 18 is an embodiment of an association in series between a one-electrode cell and an electrode-conductor in which a potential difference $V_F$ is observed in the one-electrode cell and a potential difference $V_C$ is observed in the electrode-conductor.

FIG. 18 shows an example of a closed circuit constituted by two cells set 180 as if they were to be associated in series but with no physical contact between the one-electrode cell 20 and an electrode-conductor 400. As an experiment, the measurement of $V_F$ potential can show $V_F \geq 1.0$ V and a current $I_F \geq 200$ µA at approximately T$\geq$−70° C. when the cell is heating from liquid nitrogen temperature. In the same experiment, $V_C \geq 0.8$ V at T$\geq$20° C.

It is well known that for materials like $BaTiO_3$ which are semiconductors, below the Curie temperature, the high resistance crystal gives rise, in its boundaries, to ferroelectric characteristics with high dielectric constant and a low potential barrier that electrons can easily penetrate resulting in low resistivity (Bain and Chand, Ferroelectrics principles and applications, Wiley-VCH, 2017, chapter 4, pg. 93).

The typical sheet carrier density, $n_{2D}$, attainable in conventional metal-insulator-semiconductor field emission transistors (FET) is only $n_{2D} \neq 1 \times 10^{13}$ cm$^{-2}$, which is unsatisfactory for inducing superconductivity. In the cells in the present invention, the superconductivity is observed at low to high temperatures and the number of charge carriers accumulated at the interface electrode/ferroelectric is calculated to be $n_{2D} \geq 10^{15}$ cm$^{-2}$.

The enablement of the ferroelectric-induced superconductivity does not relate to the ferroelectric structure, as the ferroelectric insulator 200 can be an amorphous or a glass, but a great deal with the dynamic coalescence and alignment of the dipoles that enable superconductivity. In the present devices, superconductivity happens at the surface of the very high dielectric constant ferroelectric material in contact with air, a metal or any other material with a very different dielectric constant.

It is possible that in the embodiments 30 to 120 electrons can be conducted across the physical insulator barrier between electrodes, cells or devices.

The polarization charges on the surface of the Lorentz cavity in a dielectric material (a spherical cavity containing molecules that are polarized in the presence of an electric field) may be considered as forming a continuous distribution. Moreover, if the material is isotropic, all the atoms can be replaced by point dipoles parallel to each other and the electric field due to the dipoles is reduced to zero. Then the total electric field is, $$E = E_{appl.} + \frac{P}{3\varepsilon_0} \quad (1)$$

where E is the total electric field, $E_{appl.}$ is the applied external electric field, P is the polarization vector and $\varepsilon_0$ the vacuum's permittivity. Oversimplifying for a ferroelectric-insulator 200 like $Li_{2.99}Ba_{0.005}ClO$, polarization can reach to P=1.5 C·cm$^{-2}$ at 25° C. (Braga et al. J. Am. Chem. Soc. 2018, 140, 17968-17976) in the absence of an applied electric field which reflects in a really high electric field capable of polarizing other materials at millimetric or higher distance inducing a Hall-effect. The electric field at the interface of two materials that are polarized to align their electrochemical potentials or Fermi levels is E$\geq$10 MVm$^{-1}$. This latter electric field is usually observed when the polarized surfaces are separated by a distance d$\leq$ 1 nm.

On the other hand, the dielectric losses $P_l$ (a power) in an insulating material having capacitance C is obtained from, $$P_l = V^2 2\pi f C \tan\delta \qquad (2)$$

Where V is the potential difference f is the frequency and tan δ the dielectric loss tangent.

The spontaneous polarization of the ferroelectric-insulator, leads to very high electric fields that can polarize other materials at a mm or cm-distance of the ferroelectric material, inducing mirror charges, and therefore, electric fields and potential differences between different sides of the materials in close proximity with the ferroelectric-insulator.

In the one-electrode cell of embodiments 10 and 20, if the electrode has higher Fermi level than the ferroelectric, the electrode accumulates electrons at the interface with the ferroelectric which accumulates cations whereas the electrons are free to be conducted at the free surface of the ferroelectric-material (in contact with air or a protective layer). An embodiment of this electrode is Al, Zn, Mg, K, Li, Na, Sr or any alloy, compound, mixture or composite with a Fermi level higher than the Fermi level of the ferroelectric.

The ferroelectric surface superconductivity facilitates the continuous charge of the one-cell electrode that would be negatively polarized. This polarization can also be achieved by the accumulation of the negative poles of the dipoles of the ferroelectric material.

The cells or devices 10 to 180 of this invention can be used for contactless charging of energy storage devices.

What is claimed is:

1. A one-electrode cell comprising:
   a ferroelectric-insulator; and
   an electrode, a ferroelectric, a ferroelectricity-induced superconductor, a semiconductor, an insulator, a superconductor, a ferroelectric-based device or parts of thereof with terminals connected to the cell in different points;
   wherein the ferroelectric-insulator has a dielectric constant $\varepsilon_r$ higher than $10^3$ at the interface and at temperatures from −40° C. to 170°,
   wherein the ferroelectric-insulator is mixed with a polymer, a resin, a plasticizer, a glue or another binder;
   wherein the ferroelectric-insulator is embedded in a matrix comprising cellulose, fibre glass, or cloth;
   wherein the ferroelectric-insulator is selected from the group consisting of: $Li_{3-2y}M_yXO$ (M=Be, Ca, Mg, Sr, Ba; X=Cl, Br, I), $Li_{3-3y}A_yXO$ (M=B, Al; X=Cl, Br, I), $Na_{3-2y}M_yXO$ (M=Be, Ca, Mg, Sr, Ba; X=Cl, Br, I), $Na_{3-3y}A_yXO$ (M=B, Al; X=Cl, Br, I), $K_{3-2y}M_yXO$ (M=Be, Ca, Mg, Sr, Ba; X=Cl, Br, I), $K_{3-3y}A_yXO$ (M=B, Al; X=Cl, Br, I), $Li_{3-2y-z}M_yH_zXO$ (M=Be, Ca, Mg, Sr, and Ba; X=Cl, Br, I), $Li_{3-3y-z}A_yH_zXO$ (M=B, Al; X=Cl, Br, I), $Na_{3-2y-z}M_yH_zXO$ (M=Be, Ca, Mg, Sr, and Ba; X=Cl, Br, I), $Na_{3-3y-z}A_yH_zXO$ (M=B, Al; X=Cl, Br, I), $K_{3-2y-z}M_yH_zXO$ (M=Be, Ca, Mg, Sr, and Ba; X=Cl, Br, I), $K_{3-3y-z}A_yH_zXO$ (M=B, Al; X=Cl, Br, I), mixtures thereof, mixtures, thereof with $CaCu_3Ti_4O_{12}$, $BaTiO_3$, $YBa_2Cu_3O_{7-x}$, $SrTiO_3$ and other ferroelectric or superconductors materials, and mixtures thereof with $Cu_2O$, $SiO_2$, $Li_2S$, $Li_2O$, LiI, $Na_2S$, $Na_2O$, NaI, $K_2S$, $K_2O$, KI, $Al_2O_3$, $MgB_2$, $H_2O$, $H_2S$, polymers, ionic liquids, and other solvents or ionic materials, wherein $0 \le y \le 1$ and $0 \le z \le 3$.

2. The one-electrode cell of claim 1, wherein the electrode-conductor is Al, Zn, Mg, K, Li, Na, an alloy, a compound, a composite, a mixture or a foam.

3. The one-electrode cell of claim 1, wherein the electrode is one of C, Cu, Fe, Ni, Sn, Ti, brass, bronze, an alloy, a compound, a composite or a foam.

4. The one-electrode cell of claim 1, wherein the electrode is one of C-foam, C-nanotubes, C-felt, C-paper, graphite, or graphene.

5. The one-electrode cell of claim 1, wherein the semiconductor is one of Si, Ga, GaAs p- or n-doped Si or p- or n-doped Ga or $BaTiO_3$.

6. The one-electrode cell of claim 1, wherein the electrode and ferroelectric-insulator comprises a rectangular, a disk, a ring, a toroidal, regular or an irregular shape.

7. The one-electrode cell of claim 1, wherein the electrode and ferroelectric-insulator comprises a saw shaped edge or a shape that propitiates charge accumulation.

8. The one-electrode cell of claim 1, wherein the cell is enclosed in a package.

9. A series of two or more one-electrode cells, wherein the one-electrode cell of two or more one-electrode cells of the series comprises:
   a ferroelectric-insulator;
   and an electrode, a ferroelectric, a ferroelectricity-induced superconductor, a semiconductor, an insulator, a superconductor, a ferroelectric-based device or parts of thereof with terminals connected to the cell in different points;
   wherein the ferroelectric-insulator is mixed with a polymer, a resin, a plasticizer, a glue or another binder;
   wherein the ferroelectric-insulator is embedded in a matrix comprising cellulose, fibre glass, or cloth;
   wherein the ferroelectric insulator has a dielectric constant $\varepsilon_r$ higher than $10^3$ at the interface and at temperatures from −40° C. to 170° C.,
   wherein the ferroelectric-insulator is selected from the group consisting of: $Li_{3-2y}M_yXO$ (M=Be, Ca, Mg, Sr, Ba; X=Cl, Br, I), $Li_{3-3y}A_yXO$ (M=B, Al; X=Cl, Br, I), $Na_{3-2y}M_yXO$ (M=Be, Ca, Mg, Sr, Ba; X=Cl, Br, I), $Na_{3-3y}A_yXO$ (M=B, Al; X=Cl, Br, I), $K_{3-2y}M_yXO$ (M=Be, Ca, Mg, Sr, Ba; X=Cl, Br, I), $K_{3-3y}A_yXO$ (M=B, Al; X=Cl, Br, I), $Li_{3-2y-z}M_yH_zXO$ (M=Be, Ca, Mg, Sr, and Ba; X=Cl, Br, I), $Li_{3-3y-z}A_yH_zXO$ (M=B, Al; X=Cl, Br, I), $Na_{3-2y-z}M_yH_zXO$ (M=Be, Ca, Mg, Sr, and Ba; X=Cl, Br, I), $Na_{3-3y-z}A_yH_zXO$ (M=B, Al; X=Cl, Br, I), $K_{3-2y-z}M_yH_zXO$ (M=Be, Ca, Mg, Sr, and Ba; X=Cl, Br, I), $K_{3-3y-z}A_yH_zXO$ (M=B, Al; X=Cl, Br, I), mixtures thereof, mixtures, thereof with $CaCu_3Ti_4O_{12}$, $BaTiO_3$, $YBa_2Cu_3O_{7-x}$, $SrTiO_3$ and other ferroelectric or superconductors materials, and mixtures thereof with $Cu_2O$, $SiO_2$, $Li_2S$, $Li_2O$, LiI, $Na_2S$, $Na_2O$, NaI, $K_2S$, $K_2O$, KI, $Al_2O_3$, $MgB_2$, $H_2O$, $H_2S$, polymers, ionic liquids, and other solvents or ionic materials, wherein $0 \le y \le 1$ and $0 \le z \le 3$, and
   wherein the two or more cells are aligned to each other and the cells are separated by a mm- or cm-distance with no physical contact,
   or
   wherein the two or more cells are in contact such that a negative electrode of one cell connects with the positive electrode of the next cell adding cell potentials.

10. The series of claim 9 wherein the cell is a conductor, a semiconductor or a superconductor.

11. The series of claim 9, wherein the negative electrode and the positive electrode (two electrodes) comprise a ferroelectric-insulator in between.

12. The series of claim 9, wherein the series of two one-electrode cell where electrodes are similar or are dissimilar forms a full cell.

13. The series of claim 9, wherein the electrodes are Zn and C.

14. The series of claim 9, further comprising: a load connected to the negative electrode of a cell and the positive electrode of a different cell, wherein the load is LED.

15. The series of claim 9, wherein the negative electrode and the positive electrode (two electrodes) are separated by one or more alternated ferroelectric or insulator materials layer-pairs.

16. Use of a one-electrode cell, wherein the one-electrode cell comprises a ferroelectric-insulator, and an electrode, a ferroelectric, a ferroelectricity-induced superconductor, a semiconductor, an insulator, a superconductor, a ferroelectric-based device or parts of thereof with terminals connected to the cell in different points,
   wherein the ferroelectric-insulator is mixed with a polymer, a resin, a plasticizer, a glue or another binder;
   wherein the ferroelectric-insulator is embedded in a matrix comprising cellulose, fibre glass, or cloth;
   wherein the ferroelectric-insulator has a dielectric constant Er higher than $10^3$ at the interface and at temperatures from −40° C. to 170° C., and
   wherein the ferroelectric-insulator is selected from the group consisting of: $Li_{3-2y}M_yXO$ (M=Be, Ca, Mg, Sr, Ba; X=Cl, Br, I), $Li_{3-3y}A_yXO$ (M=B, Al; X=Cl, Br, I), $Na_{3-2y}M_yXO$ (M=Be, Ca, Mg, Sr, Ba; X=Cl, Br, I), $Na_{3-3y}A_yXO$ (M=B, Al; X=Cl, Br, I), $K_{3-2y}M_yXO$ (M=Be, Ca, Mg, Sr, Ba; X=Cl, Br, I), $K_{3-3y}A_yXO$ (M=B, Al; X=Cl, Br, I), $Li_{3-2y-z}M_yH_zXO$ (M=Be, Ca, Mg, Sr, and Ba; X=Cl, Br, I), $Li_{3-3y-z}A_yH_zXO$ (M=B, Al; X=Cl, Br, I), $Na_{3-2y-z}M_yH_zXO$ (M=Be, Ca, Mg, Sr, and Ba; X=Cl, Br, I), $Na_{3-3y-z}A_yH_zXO$ (M=B, Al; X=Cl, Br, I), $K_{3-2y-z}M_yH_zXO$ (M=Be, Ca, Mg, Sr, and Ba; X=Cl, Br, I), $K_{3-3y-z}A_yH_zXO$ (M=B, Al; X=Cl, Br, I), mixtures thereof, mixtures, thereof with $CaCu_3Ti_4O_{12}$, $BaTiO_3$, $YBa_2Cu_3O_{7-x}$, $SrTiO_3$ and other ferroelectric or superconductors materials, and mixtures thereof with $Cu_2O$, $SiO_2$, $Li_2S$, $Li_2O$, LiI, $Na_2S$, $Na_2O$, NaI, $K_2S$, $K_2O$, KI, $Al_2O_3$, $MgB_2$, $H_2O$, $H_2S$, polymers, ionic liquids, and other solvents or ionic materials, wherein $0 \le y \le 1$ and $0 \le z \le 3$, comprising:
a device for an energy harvester, energy storage device, part of a transistor, of a computer, of a quantum computer, of a sensor, of a charger, of an actuator, of a thermionic device, of a temperature controller, of the Internet of Things, of a photovoltaic cell, of a panel, of a wind turbine, of a smart grid, of an electric power transmission, of a transformers, of a power storage devices, of an electric motor, of an airplane, of a car, of a boat, of a submarine, of a satellite, of a drone, of a rocket and/or of a space vehicle.

* * * * *